United States Patent [19]

Skar

[11] 4,453,269
[45] Jun. 5, 1984

[54] APPARATUS FOR IMPROVING THE FREQUENCY STABILITY OF A TRANSMITTER OSCILLATOR CIRCUIT

[75] Inventor: Robert C. Skar, Glen Ellyn, Ill.

[73] Assignee: Chamberlain Manufacturing Corporation, Elmhurst, Ill.

[21] Appl. No.: 421,285

[22] Filed: Sep. 22, 1982

[51] Int. Cl.³ .............................................. H04B 1/04
[52] U.S. Cl. .................................. 455/129; 455/124; 331/114; 331/117 D
[58] Field of Search .................. 455/91, 95, 111, 119, 455/124, 129; 331/96, 107 DP, 117 D, 114, 117 R; 340/825.69, 825.72

[56] References Cited

U.S. PATENT DOCUMENTS

| 3,611,146 | 10/1971 | Cooper | 455/129 |
| 3,778,717 | 12/1973 | Okoshi et al. | 455/129 |
| 4,053,897 | 10/1977 | Nerheim | 331/107 DP |
| 4,086,535 | 4/1978 | Shibata et al. | 455/129 |

Primary Examiner—Jin F. Ng
Attorney, Agent, or Firm—Hill, Van Santen, Steadman & Simpson

[57] ABSTRACT

A novel apparatus and method for improving the stability of an electrical circuit such as an oscillator and/or a radio frequency transmitter which is coupled to a radiating element wherein the radiating element such as a loop is coupled to the inductor or capacitor of the frequency determining circuit of the oscillator so that frequency shifts will not occur due to inductive or capacitive effects. The oscillator circuit is mounted on an insulating sheet which has a ground plane on the opposite side thereof so as to provide effective shielding and the radiating element is mounted on a portion of the insulating sheet where the grounding plane does not extend. The radiating element is also coupled symmetrically to the inductor or capacitors of the frequency determining circuit and is connected at tap points which do not have the entire inductance between them.

10 Claims, 8 Drawing Figures

APPARATUS FOR IMPROVING THE FREQUENCY STABILITY OF A TRANSMITTER OSCILLATOR CIRCUIT

BACKGROUND OF THE INVENTION

1. Field of the Invention

This invention relates in general to electrical oscillators and in particular to oscillators used as transmitters and having a radiating element such as an antenna.

2. Description of the Prior Art

Three basic oscillator circuits have been used in garage door transmitter circuits of the prior art and such circuits without considering the DC connections and auxiliary components require an active device, a tuned circuit and a feedback circuit. A circuit ground point where the AC potential with respect to an earth ground is zero generally exists at one of the electrodes of the active element such as a transistor. With small remote control unshielded battery operated transmitters having no external connection, a concept of a ground may be nebulous, however, this concept becomes more obvious in a balanced circuit such as a circuit connected in push-pull with a pair of active elements or in the case of a shielded circuit. Where no actual ground exists in a transmitter or oscillating circuit, a "common" point or element of the active device can be defined.

FIG. 1a illustrates a Colpitts oscillator. FIG. 1b illustrates a Hartley oscillator circuit and FIG. 1c illustrates a push-pull oscillator circuit. It is obvious in the Hartley oscillator circuit of FIG. 1b that the mid-point of the coil is at AC ground potential. There is a virtual ground at the center of the coil in the circuit of FIG. 1c as well as in the circuit of FIG. 1a where it is a point determined by the ratio of the two capacitors in the resonating circuit.

Garage door transmitters operate in the frequency range such as 390 MHz and in this range, a tuning inductor can be constructed as a relatively large single turn loop illustrated in FIG. 2 on a substrate 10. The center of the loop is grounded as illustrated and a loop is formed as a wide flat strip so as to minimize series resistance and inductance per unit length of conductor and the efficiency of the loop as a radiator increases as the area increases.

Unfortunately, the circuit illustrated in FIG. 2 is subject to pulling of its frequency from at least two separate sources. If an ungrounded conductive sheet is placed near and parallel to the loop, the frequency will rise due to loss of inductance caused by inductive coupling to the conductive sheet. On the other hand, if a metallic object is effectively grounded and is coupled capacitively to the "hot" end of the coil, the frequency will be lowered because of the increase in tuning capacitance. In certain cases, the two effects will tend to cancel each other but in general the frequency shift will be unacceptably large. The reason for this is that garage door transmitters for example must be precisely tuned so as to cause a particular receiver for a particular garage door to respond. Frequency drift would cause other receivers not tuned to the particular transmitter to respond and also would prevent the desired receiver from responding to the transmitter.

SUMMARY OF THE INVENTION

In the present invention an oscillator circuit is shielded by providing a conductive ground plane on the reverse side of an insulating substrate such as a ceramic substrate in those areas of the oscillator circuit which include the active element and the resonant circuit and the feedback path. A separate unshielded loop antenna is connected to tap points on the inductor of the resonant circuit and is mounted on a portion of the substrate where a grounding plane is not present on the opposite side. Furthermore, the unshielded loop antenna will be connected to points on the tuning inductor such that it is tapped across a small portion of the tuning coil. The results are that the capacitive type interference mentioned above will not be present because the antenna loop is at virtual ground potential. Inductive coupling will be minimized because the antenna coil is tapped across a small portion of the tuning coil. This will result in less radiation for a given amount of oscillator power but the U.S. Government regulations severely restrict the permissible amount of radiated power.

The invention can also work with a capacitor voltage divider and the circuit results in stable oscillator which is not subject to drift or frequency pull.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

Figure 1A:
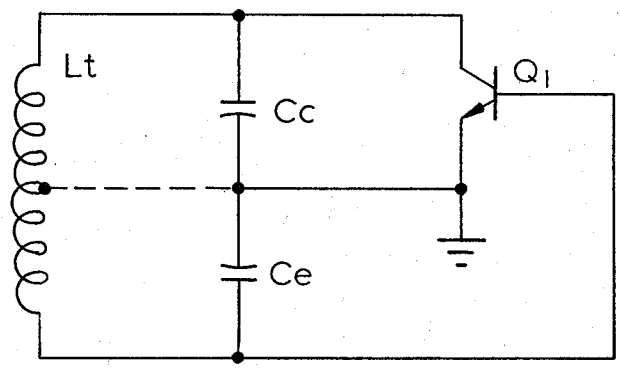
FIG. 1a illustrates a Colpitts oscillator of the prior art.
Figure 1B:
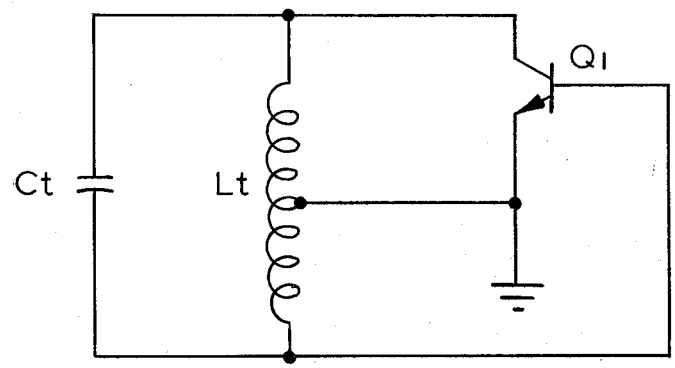
FIG. 1b illustrates a Hartley oscillator of the prior art.
Figure 1C:
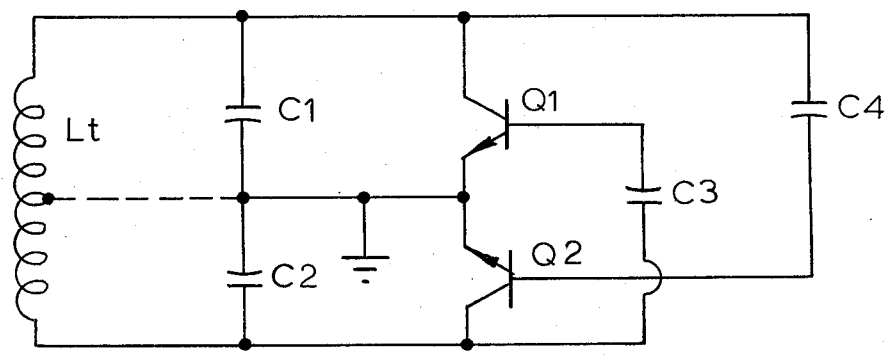
FIG. 1c illustrates a push-pull oscillator.
Figure 2:
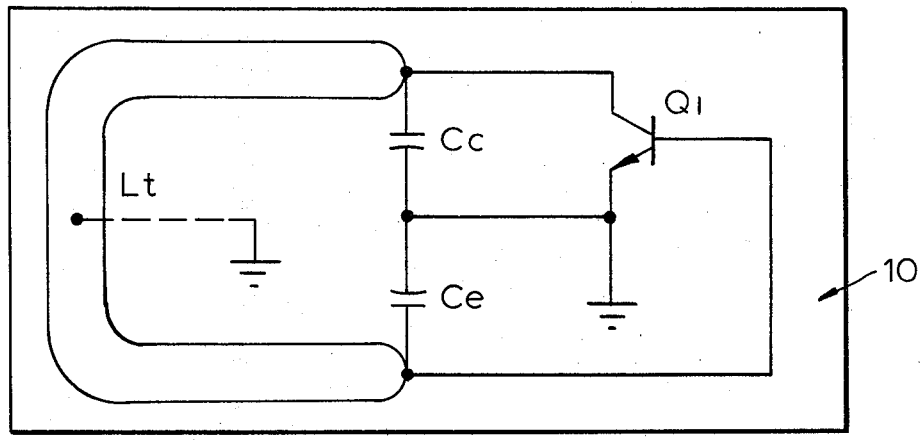
FIG. 2 illustrates a Colpitts oscillator with a loop inductor.

FIG. 2 illustrates a Colpitts oscillator with a loop inductor of the prior art which is formed on an insulating substrate 10 and which can be formed in hybrid fashion with the transistor mounted on the board with the emitter connected to ground and the base connected to one end of the loop conductor $L_T$. A pair of capacitors $C_c$ and $C_e$ are connected in series across the loop inductor $L_T$ and the midpoint is grounded. This circuit is subject to frequency shift as explained above.

Figure 3:
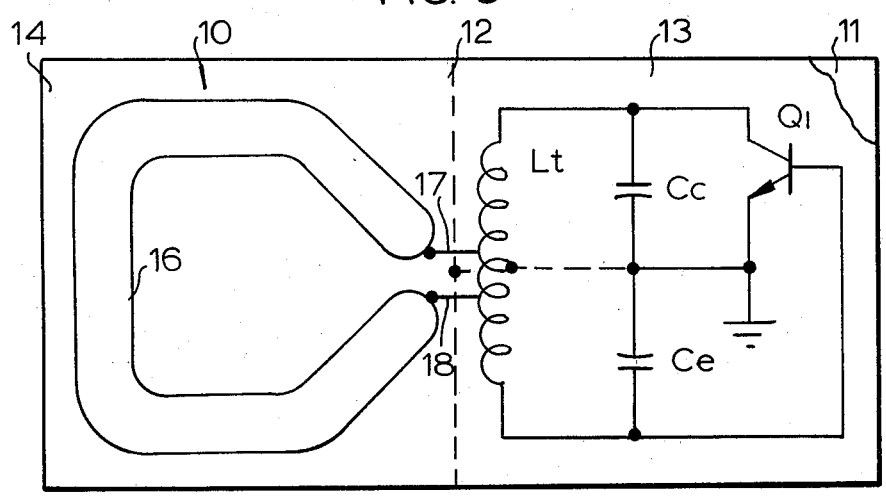
FIG. 3 illustrates the oscillator of the invention with an external loop antenna.

FIG. 3 illustrates the invention wherein a substrate 10 of insulating material is provided with a conductive layer as for example, of copper foil 11 on the backside thereof and such conductive layer extends to a line 12 as shown. The driving transistor Q1, the capacitors $C_c$ and $C_e$ and the inductor $L_T$ are connected as shown and are formed on the side opposite the layer 11 of conductive foil.

An external loop antenna 16 is formed on the portion 14 which does not have the ground plane 11 on the other side thereof and the ends 17 and 18 are tapped to the inductor $L_t$ at points which are symmetrical with respect to the ground or center point of the inductor and also intermediate the ends of the inductor so that only a portion of the total inductance is tapped by the external loop antenna 16.

The detuning effects and frequency drift are minimized by the circuit of the invention illustrated in FIG. 3. The entire oscillator circuit is shielded so that coupling effects to the circuit are greatly lowered. In a specific hybrid circuit constructed according to the invention, the shielding was accomplished by using a ground plane of copper foil on the reverse side of a ceramic substrate 10 about 0.025 inches in thickness and the substrate 10 was ceramic substrate. It is to be realized, of course, that without the loop antenna 16 that the circuit would not radiate because of the ground plane but with the loop antenna 16 which is connected across a section of the tuning inductor which is at virtually ground potential radiation occurs. Capacitive type interference mentioned above was not present in the structure because the antenna loop 16 is at virtual ground potential. Inductive coupling will be minimized because the antenna coil 16 is tapped across a small portion of the tuning coil. Although this might result in less radiation for a given amount of oscillator power as compared to the circuit of FIG. 2, the U.S. Government regulations severely restrict the permissible amount of radiated power and more than adequate power will be radiated with the invention illustrated in FIG. 3.

Figure 4:
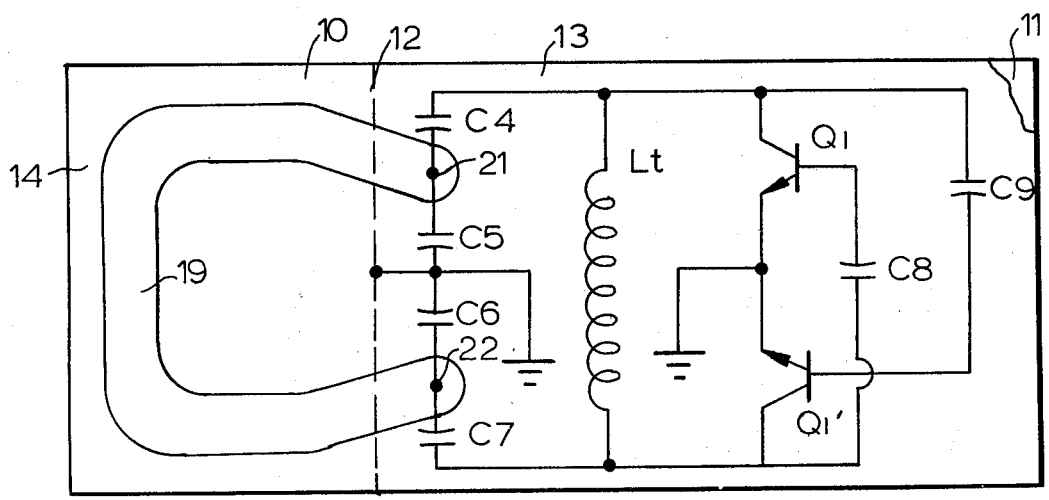
FIG. 4 illustrates a modification of the invention utilizing antenna feed with tapped capacitors.

FIG. 4 illustrates a modification of the invention wherein the external loop antenna 19 is coupled using a capacitive voltage divider comprising the capacitors C4, C5, C6 and C7 and using a push-pull type oscillator with a pair of transistors Q1 and Q1' connected as shown. The ground plane 11 extends to the line 12 as in the embodiment of FIG. 3.

Figure 6:
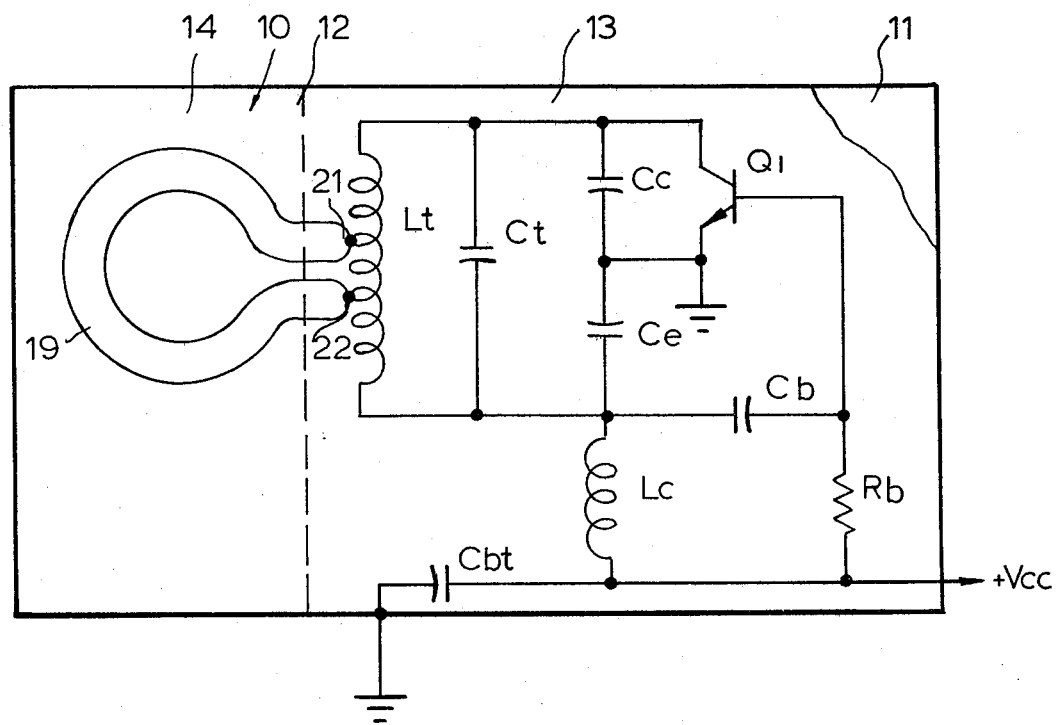
FIG. 6 is an electrical schematic of the circuit of FIG. 5.

FIGS. 6 and 7 illustrate practical embodiments of the invention which have been constructed and operated successfully and in the circuit of FIG. 6 the driving voltage Vcc, a base to battery resistor $R_B$, a capacitor $C_{BT}$, and inductor $L_O$ and a capacitor $C_B$ connected as shown were utilized. The loop antenna 19 had its ends 21 and 22 coupled to the inductor $L_t$. In addition, a tunable capacitor $C_T$ was connected in parallel with the inductor $L_t$ and the capacitors $C_c$ and $C_e$.

Figure 5:
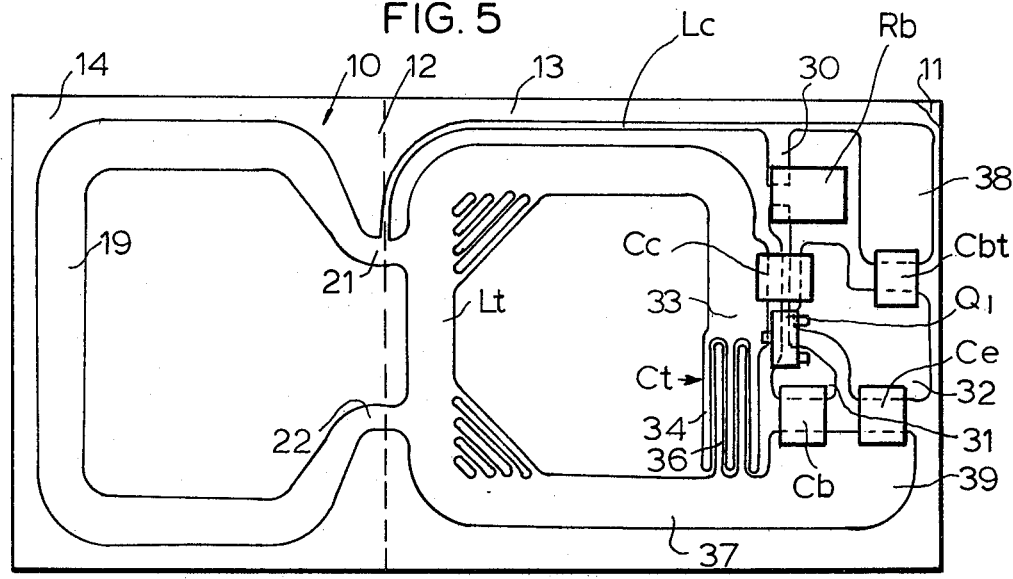
FIG. 5 illustrates a plan view of the invention.

FIG. 5 illustrates the substrate 10 with a conductive foil 11 formed on a portion of the substrate and extending to the line 12. The loop antenna 19 was formed with a relatively wide conductive foil 19 as shown and its ends 21 and 22 tapped onto the inductance $L_t$ which also was a relatively wide conductive foil formed as shown. The inductance Lc extends from the tap point 21 to a foil region 30 across which the resistor $R_b$ was connected. The other conductive regions correspond to the various capacitors and inductors illustrated in FIG. 6 and the transistor Q1 had its base connected to a foil region 31, its emitter connected to a grounded region 32 and its collector connected to a region 33 which is connected to one side of the tuning inductor $L_t$. The capacitor $C_t$ is formed between interdigitally formed foil portions 34 and 36 with the portions 34 connected to the foil 33 and the fingers 36 connected to the foil 37 which is connected to and forms the main inductor $L_t$.

In an oscillator constructed according to the invention, the substrate 10 was one inch by two inches. The circuit has been constructed and tested and is very stable and is not subjected to frequency drift as are the prior art oscillators.

Although the invention has been described with respect to preferred embodiments, it is not to be so limited as changes and modifications can be made which are within the full intended scope of the invention as defined by the appended claims.

I claim as my invention:

1. A circuit for radiating radio frequency energy comprising, a planar insulating member, a conductive layer attached to one planar surface of said insulating member to cover a portion of its area, a radio frequency oscillator attached to the second planar surface of said insulating member over said conductive layer, and a radiating loop coupled to said oscillator and attached to said second planar surface of said insulating member over the portion of said one planar surface of said insulating member not covered by said conductive layer.

2. A circuit for radiating radio frequency energy according to claim 1 wherein said oscillator includes a resonant circuit with a virtual ground and said radiating loop attached to said resonant circuit so that it is symmetrical to ground.

3. A circuit for radiating radio frequency energy according to claim 2 wherein said resonant circuit includes an inductor and said radiating loop is symmetrically coupled to said inductor.

4. A circuit for radiating radio frequency energy according to claim 2 wherein said resonant circuit includes a plurality of capacitors and said radiating loop is symmetrically coupled to said plurality of capacitors.

5. A circuit for radiating radio frequency energy according to claim 3 wherein the center of said inductor is grounded and said radiating loop has its opposite ends attached to points on said inductor which are on opposite sides of its center.

6. A circuit for radiating radio frequency energy according to claim 5 wherein said radiating loop has its opposite ends attached to points on said inductor at which the inductances to ground are equal.

7. A circuit for radiating radio frequency energy according to claim 6 wherein said radiating loop is attached to said inductor at points on said inductor which do not encompass the total inductance of said inductor.

8. A circuit for radiating energy according to claim 7 wherein said radiating loop is formed as conducting foil which is attached to said insulating member.

9. A circuit for radiating energy according to claim 8 wherein said inductor is formed as a conducting foil which is attached to said insulating member.

10. A circuit for radiating energy according to claim 9 wherein said insulating member is a ceramic substrate.

* * * * *